United States Patent
Yang et al.

(10) Patent No.: US 9,437,576 B1
(45) Date of Patent: Sep. 6, 2016

(54) SEMICONDUCTOR DEVICE PACKAGE AND METHOD OF MANUFACTURING THE SAME

(71) Applicant: Advanced Semiconductor Engineering, Inc., Kaosiung (TW)

(72) Inventors: Tau-Jing Yang, Kaohsiung (TW); Kuo-Feng Huang, Kaohsiung (TW); Wei Yu Nien, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/665,800

(22) Filed: Mar. 23, 2015

(51) Int. Cl.
*H01L 25/065* (2006.01)
*H01L 23/552* (2006.01)
*H01L 23/538* (2006.01)
*H01L 23/31* (2006.01)
*H01L 25/00* (2006.01)

(52) U.S. Cl.
CPC ....... *H01L 25/0655* (2013.01); *H01L 23/3157* (2013.01); *H01L 23/5386* (2013.01); *H01L 23/552* (2013.01); *H01L 25/50* (2013.01)

(58) Field of Classification Search
CPC .................................................. H01L 25/0655
See application file for complete search history.

(56) References Cited

U.S. PATENT DOCUMENTS

| | | | |
|---|---|---|---|
| 6,781,231 B2 | 8/2004 | Minervini | |
| 7,161,252 B2 * | 1/2007 | Tsuneoka | H01L 23/3121 257/100 |
| 7,629,674 B1 | 12/2009 | Foster | |
| 8,039,930 B2 | 10/2011 | Liao et al. | |
| 8,253,226 B2 | 8/2012 | Oguri | |
| 8,653,634 B2 * | 2/2014 | Chiu | H01L 24/97 257/415 |
| 8,861,221 B2 * | 10/2014 | Pagaila | H01L 23/3677 361/783 |
| 9,070,793 B2 * | 6/2015 | Liao | H01L 23/3121 |
| 2004/0252475 A1 * | 12/2004 | Tsuneoka | H01L 23/3121 361/816 |
| 2010/0110656 A1 * | 5/2010 | Ko | H01L 21/561 361/818 |
| 2010/0175242 A1 * | 7/2010 | Wu | H04R 19/005 29/594 |
| 2011/0274299 A1 * | 11/2011 | Shaw | B81B 7/0064 381/174 |
| 2015/0036296 A1 * | 2/2015 | Chen | H05K 9/0007 361/728 |

\* cited by examiner

*Primary Examiner* — Lex Malsawma
(74) *Attorney, Agent, or Firm* — Foley & Lardner LLP; Cliff Z. Liu; Angela D. Murch

(57) ABSTRACT

A semiconductor device package includes a substrate, a first electrical component, a second electrical component, and a conductive frame disposed on a top surface of the substrate. The conductive frame has a top portion and a rim substantially perpendicular to the top portion. The conductive frame covers the first electrical component, and includes at least one opening in the top portion of the conductive frame, one of which openings exposes the second electrical component. A top surface of the top portion of the conductive frame is substantially coplanar with a top surface of the second electrical component. The semiconductor device package further includes an electromagnetic interference shield in contact with the top surface of the top portion of the conductive frame, an outer lateral surface of the rim of the conductive frame, and the top surface of the second electrical component.

20 Claims, 3 Drawing Sheets

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly, to a semiconductor device package with a shielding cover and a manufacturing method thereof.

2. Description of the Related Art

Semiconductor devices have become progressively more complex, driven at least in part by the demand for enhanced processing speeds and smaller sizes. Enhanced processing speeds tend to involve higher clock speeds, which can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of the neighboring semiconductor device. This phenomenon is sometimes referred to as electromagnetic interference (EMI). Smaller sized semiconductor devices can exacerbate EMI by providing a higher density of semiconductor devices within an overall electronic system, and, thus, a higher level of undesired electromagnetic emissions at neighboring semiconductor devices.

One way to reduce EMI is to shield a set of semiconductor devices within a semiconductor device package. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

However, EMI shielding increases the total size of a semiconductor device package, and thus it may not satisfy the demands brought on by developments in high density integrated circuits.

SUMMARY

In accordance with an embodiment of the present disclosure, a semiconductor device package includes a substrate, a first electrical component, a second electrical component, a conductive frame, and an electromagnetic interference shield. The substrate has a top surface. The first electrical component is disposed on the top surface of the substrate. The second electrical component is disposed on the top surface of the substrate. The second electrical component has a top surface. The conductive frame has a top portion and a rim substantially perpendicular to the top portion. The top portion has a top surface. The conductive frame is disposed on the top surface of the substrate to cover the first electrical component. The conductive frame defines at least one opening in the top portion of the conductive frame. The at least one opening exposes the second electrical component. The top surface of the top portion of the conductive frame is substantially coplanar with the top surface of the second electrical component. The electromagnetic interference shield is in contact with the top surface of the top portion of the conductive frame, an outer lateral surface of the rim of the conductive frame, and the top surface of the second electrical component.

In accordance with an embodiment of the present disclosure, a method of manufacturing a semiconductor device package comprises: (a) providing a substrate having a top surface; (b) attaching a first electrical component and a second electrical component on the top surface of the substrate, the second electrical component having a top portion; (c) placing a conductive frame on the top surface of the substrate to cover the first electrical component, the conductive frame including a top portion and a rim substantially perpendicular to the top portion, the top portion having a top surface, the conductive frame defining at least one opening in the top portion of the conductive frame, the least one opening exposing the second electrical component, and the top surface of the top portion of the conductive frame being substantially coplanar with the top surface of the second electrical component; (d) placing an electromagnetic interference shield on the conductive frame in contact with the top surface of the top portion of the conductive frame, an outer lateral surface of the rim of the conductive frame, and the top surface of the second electrical component.

Figure 1A:
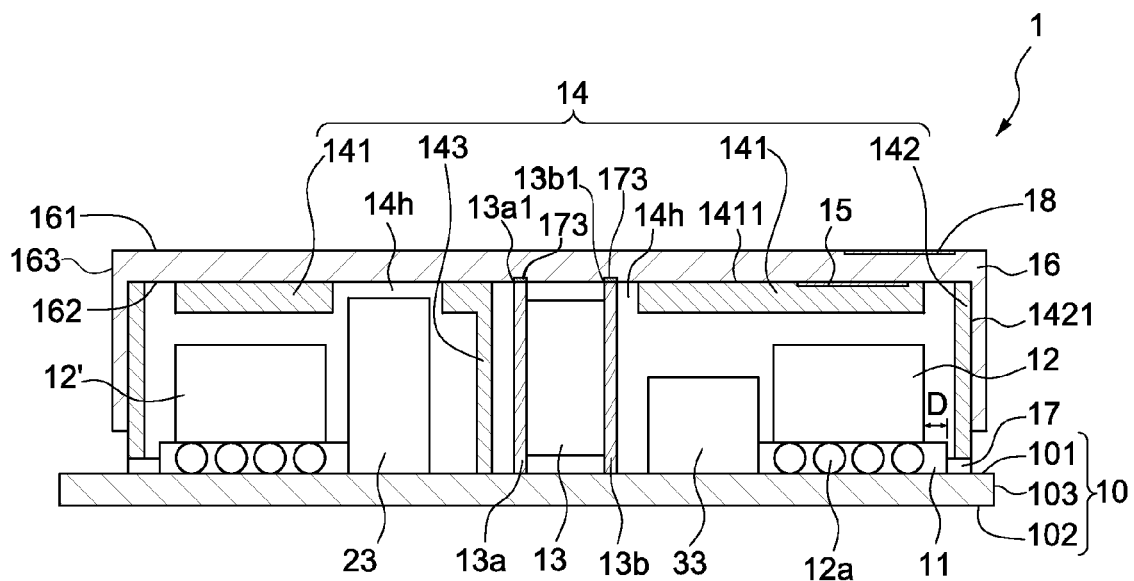
FIG. 1A illustrates a cross-sectional view of a semiconductor device package in accordance with an embodiment of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

Because EMI shielding in the form of housings or casings increases the size of a semiconductor package, the use of such shielding is counter-indicated for implementation within small semiconductor devices. This disclosure describes techniques for EMI shielding suitable for smaller semiconductor device packages, which additionally reduces manufacturing costs.

FIG. 1A illustrates a cross-sectional view of a semiconductor device package 1 in accordance with an embodiment of the present disclosure. The semiconductor device package 1 includes a substrate 10, a plurality of active electrical components 12, 12', a plurality of other electrical components 13, 23, 33, a conductive frame 14, and an EMI shield 16.

The substrate 10 has a top surface 101, a bottom surface 102 opposite to the top surface 101 and a lateral surface 103. The lateral surface 103 is at a peripheral edge of the substrate 10, and extends between the top surface 101 and the bottom surface 102. The substrate 10 may be, for example, a printed circuit board, such as a paper-based copper foil laminate, a composite copper foil laminate, or a polymer-impregnated glass-fiber-based copper foil laminate. The substrate 10 may include an interconnection structure (not shown in FIG. 1A), such as a redistribution layer (RDL), for electrical connection between the electrical components 13, 23, 33 and/or the active electrical components 12, 12' mounted on a top surface 101 of the substrate 10.

The active electrical component 12 is mounted on the top surface 101 of the substrate 10. The active electrical component 12 may be a flip-chip type semiconductor device. According to another embodiment of the present disclosure, the active electrical component 12 may be a wire-bond type semiconductor device. The active electrical component 12 may be, for example, an integrated chip (IC) or a die.

Electrical contacts 12a of the active electrical component 12 are encapsulated by an underfill 11 which is used to protect the electrical contacts 12a. The underfill 11 may be, for example, epoxy or other suitable material.

The electrical components 13, 23, 33 are mounted on the top surface 101 of the substrate 10. The electrical components 13, 23, 33 may be, for example, capacitors, resistors, inductors, or a combination thereof. The electrical component 13 has two electrical contacts (electrodes) 13a and 13b, each of which has a surface, respectively 13a1, 13b1.

The conductive frame 14 has a top portion 141, a rim (fence) 142 and at least one compartment 143. The top portion 141 has a top surface 1411. The rim 142 and the compartment 143 are substantially perpendicular to the top portion 141. The conductive frame 14 is mounted on the top surface 101 of the substrate 10 to cover the active electrical components 12, 12' and the electrical component 33. The top portion 141 of the conductive frame 14 has at least one opening 14h to expose the electrical components 13, 23. The top surface 1411 of the top portion 141 of the conductive frame 14 is substantially coplanar with the surfaces 13a1, 13b1 of the first electrical component 13, which is the component which extends vertically the highest in the semiconductor device package 1, where the term "vertically" refers to the orientation shown in FIG. 1A. The conductive frame 14 may include one or more metals, or a mixture, an alloy, or other combination thereof.

The conductive frame 14 is mounted on the top surface 101 of the substrate 10 through a connection member 17. That is, the conductive frame 14 is electrically connected to a grounding plane of the substrate 19 through the connection member 17. The connection member 17 may be, for example, a conductive bonding material. The connection member 17 is separated from the active electrical component 12 by a distance D equal to or smaller than about 0.2 millimeter (mm), such as less than or equal to about 0.19 mm, about 0.18 mm, about 0.17 mm, about 0.16 mm, about 0.15 mm, about 0.14 mm, about 0.13 mm, about 0.12 mm, about 0.11 mm, or about 0.1 mm.

The compartment 143 extends from the top portion 141 of the conductive frame 14 to separate the active electrical component 12 from the active electrical component 12' disposed on the top surface 101 of the substrate 10. The compartment 143 reduces the effect on the active electrical component 12 of electromagnetic emissions generated by the active electrical component 12' (e.g. EMI or cross-talk), and vice versa. The compartment 143 can further separate a first set of electrical components 13, 33 from a second set of electrical components 23 disposed on the top surface 101 of the substrate 10, to reduce the effect on the electrical components 23 of electromagnetic emissions generated by the electrical components 13, 33, and vice versa.

A first pattern 15 may be, for example, barcodes or other recognition codes (e.g., quick response (QR) code) that represent information corresponding to the semiconductor device package 1, such as a serial number of the semiconductor device package 1 and a unit number of the substrate 10. In one embodiment, a first pattern 15 can be formed from the top surface 1411 into the top portion 141 of the conductive frame 14. In other words, the top portion 141 of the conductive frame 14 is substantially coplanar with the top surface of the first pattern 15 and the EMI shield 16 directly contacts the first pattern 15. The first pattern 15 can be formed by, for example, laser techniques or other suitable techniques.

The EMI shield 16 is disposed on the external surface of the conductive frame 14. The EMI shield 16 is in contact with the top surface 1411 of the top portion 141 of the conductive frame 14, an outer lateral surface 1421 of the rim 142 of the conductive frame 14 and the surfaces 13a1, 13b1 of the first electrical component 13. The EMI shield 16 may be a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. Accordingly, the EMI shield 16 and the conductive frame 14 can reduce the effect on the active electrical components 12, 12' and the electrical components 13, 23, 33 disposed in the semiconductor device package 1 of electromagnetic emissions generated by semiconductor devices outside the semiconductor package 1. Since the conductive frame 14 is grounded through the connection member 17, and the EMI shield 16 directly contacts the conductive frame 14, the EMI shield 16 is grounded through the conductive frame 14.

The EMI shield 16 has a top surface 161, a bottom surface 162 opposite to the top surface 161, and a lateral surface 163. In one embodiment, as illustrated in FIG. 1A, the lateral surface 103 of the substrate 10 extends horizontally beyond the lateral surface 163 of the EMI shield 16, on one or both sides of the semiconductor package 1, where the term "horizontally" is with respect to the orientation of the semiconductor package 1 illustrated by FIG. 1A. In another embodiment, the lateral surface 163 of the EMI shield 16 is substantially coplanar with the lateral surface 103 of the substrate 10, on one or both sides of the semiconductor package 1. In one embodiment, at least one insulation pad 173 is formed on the bottom surface 162 of the EMI shield 16 and contacts the surfaces 13a1, 13b1 of the electrical component 13, to electrically isolate the EMI shield 16 from the surfaces 13a1, 13b1 of the electrical component 13. In another embodiment, the surfaces 13a1, 13b1 of the electrical component 13 may be surfaces of electrical insulators positioned on contacts 13a, 13b respectively, and thus the EMI shield 16 can be in direct contact with the surfaces 13a1, 13b1 of the electrical component 13, and the insulation pad(s) 173 may be eliminated.

The EMI shield 16 may include a single conductive layer. In accordance with another embodiment of the present disclosure, the EMI shield 16 may include several conductive layers formed of the same material or of different materials. In some embodiments, each conductive layer may have a thickness of, for example, up to about 200 μm, up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less.

A second pattern 18 may be, for example, barcodes or other recognition codes that represent information corresponding to the semiconductor device package 1, such as a shipment number of the semiconductor package 1. In one embodiment, the second pattern 18 can be formed from the top surface 161 into the EMI shield 16. That is, the top surface of the second pattern 18 is coplanar with the top surface 161 of the EMI shield 16. The second pattern 18 can be formed by, for example, laser techniques or other suitable techniques.

In some embodiments, rather than forming the first pattern 15 and the second pattern 18, a sticker including a barcode other code may be applied. For example, a sticker may be applied to one or both of the top portion 141 of the conductive frame 14 and the top surface 161 of the EMI shield 16. However, such a sticker may have a thickness of approximately 0.02 mm, which may result in an increase in a height of the semiconductor device package 1. Therefore, forming the barcode or other code by using laser techniques can reduce a total height of the semiconductor device package 1.

Figure 1B:
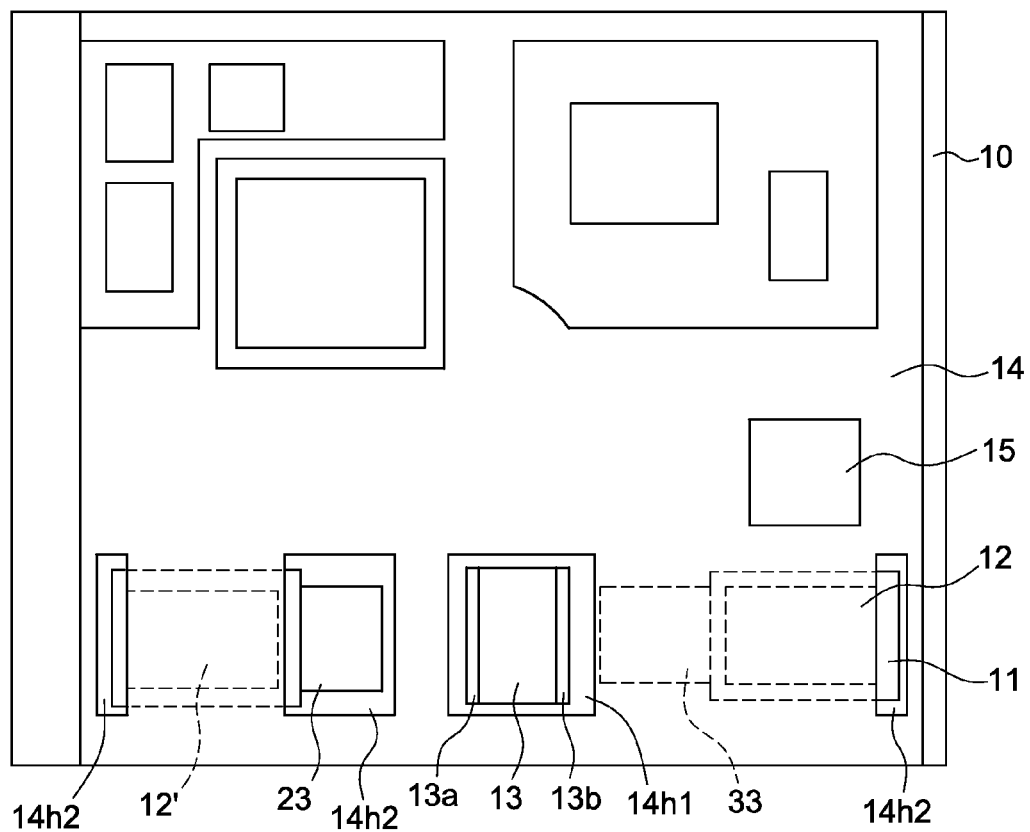
FIG. 1B illustrates a top view of a semiconductor device package in accordance with an embodiment of the present disclosure.

FIG. 1B illustrates a top view of the semiconductor device package 1 in accordance with an embodiment of the present disclosure. The semiconductor device package 1 shown in FIG. 1B is similar to that shown in FIG. 1A, except that the EMI shield 16 is not included. The opening 14h1 is formed corresponding to the location of the component extending vertically the highest in the semiconductor package 1, (e.g., electrical component 13 in FIG. 1A), so that the bottom surface 162 of the EMI shield 16 is coplanar with the highest portion of that component. In this way, in embodiments including the EMI shield 16, the EMI shield 16 is placed to cover a top surface of the semiconductor package device 1 along a plane. By including the opening 14h1 to expose the top portion of the electrical component 13, a total height of the semiconductor device package 1 depicted in FIGS. 1A and 1B may be reduced by at least about 0.25 mm, which may, in turn, reduce manufacturing costs. The openings 14h2 are formed in the conductive frame 14 taking into consideration a balancing of stresses on the conductive frame 14.

Figure 2A:
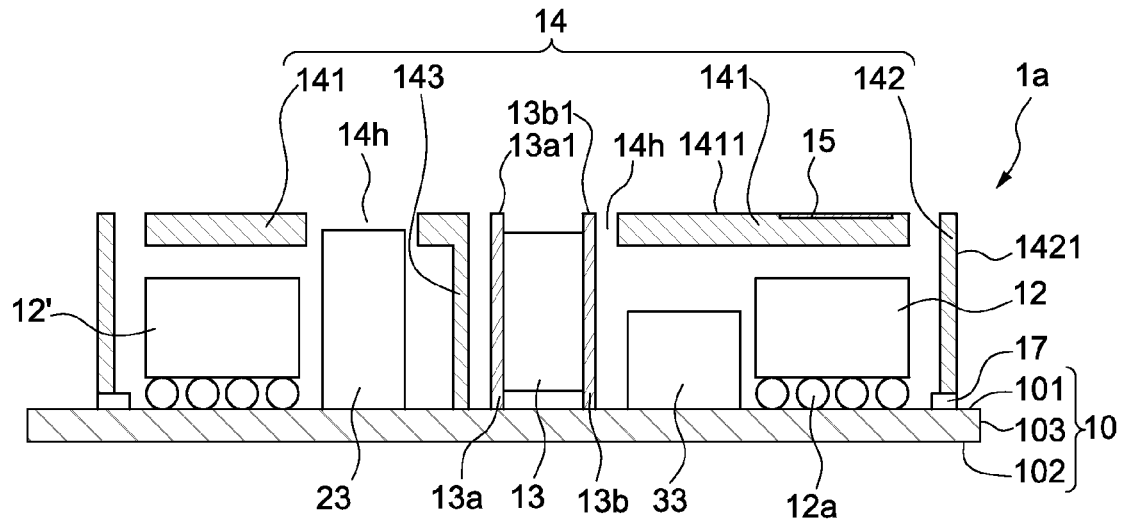
FIG. 2A, FIG. 2B and FIG. 2C illustrate a manufacturing process in accordance with an embodiment of the present disclosure.
Figure 2B:
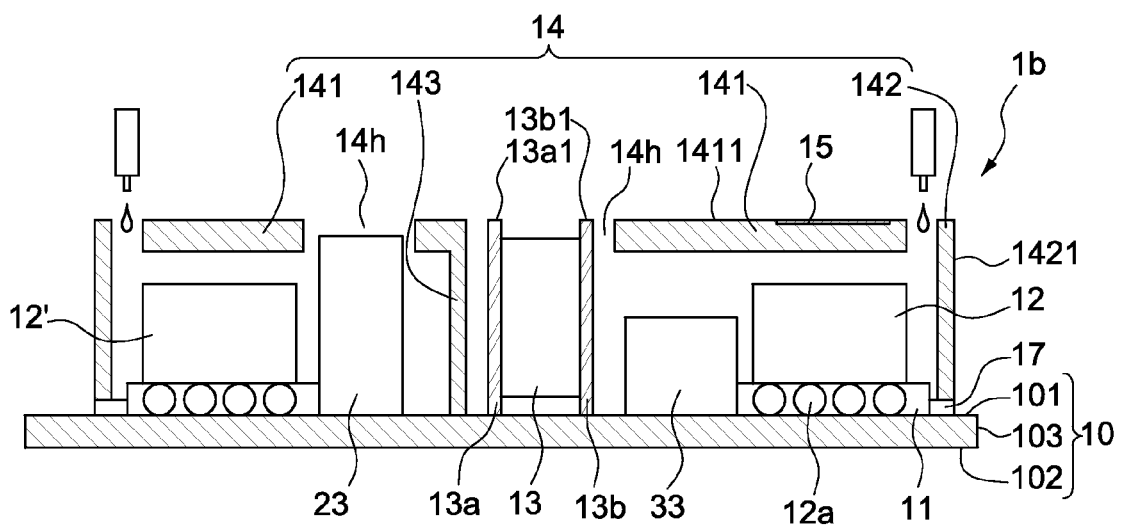
Figure 2C:
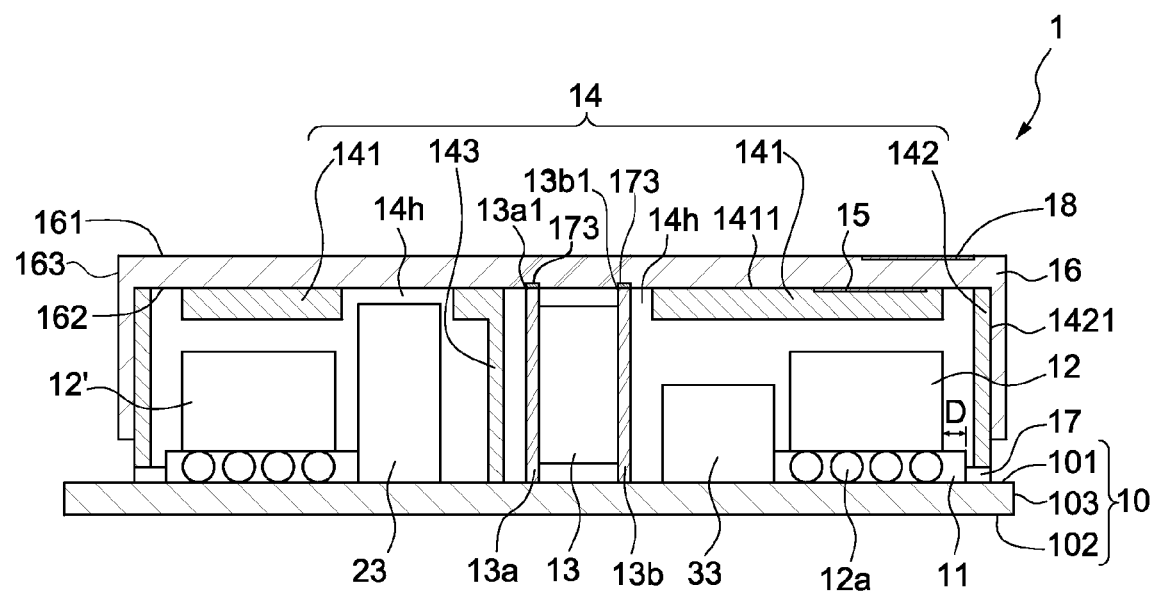

FIG. 2A, FIG. 2B and FIG. 2C illustrate a semiconductor manufacturing process in accordance with an embodiment of the present disclosure.

Referring to FIG. 2A, a partial semiconductor device package 1a is illustrated, including a substrate 10. A plurality of active electrical components 12, 12' and a plurality of electrical components 13, 23, 33 are attached on a top surface 101 of the substrate 10.

A conductive frame 14 is positioned over and mounted on the top surface 101 of the substrate 10 through a connection member 17. The connection member 17 may be, for example, a conductive bonding material.

The conductive frame 14 has a top portion 141, a rim 142 and at least one compartment 143. The top portion 141 has a top surface 1411. The rim 142 and the compartment 143 are substantially perpendicular to the top portion 141. The conductive frame 14 covers the active electrical components 12, 12' and the electrical component 33. The top portion 141 of the conductive frame 14 has at least one opening 14h to expose the electrical components 13, 23. The top surface 1411 of the top portion 141 of the conductive frame 14 and the surfaces 13a1, 13b1 of the first electrical component 13, which is the component which extends vertically the highest in the semiconductor device package 1, are substantially coplanar.

The compartment 143 extends from the top portion 141 of the conductive frame 14 to separate the active electrical component 12 from the active electrical component 12' disposed on the top surface 101 of the substrate 10, to decrease the amount of electromagnetic emissions of the active electrical component 12 reaching the active electrical component 12', and to decrease the amount of electromagnetic emissions of the active electrical component 12' reaching the active electrical component 12. In another embodiment, the compartment 143 can further separate a first set of electrical components (e.g., 13, 33) from a second set of electrical components (e.g., 23) disposed on the top surface 101 of the substrate 10.

The active electrical components 12, 12', the electrical components 13, 23, 33 and the conductive frame 14 are secured or mounted on the top surface 101 of the substrate 10 by a surface mount technique. Then, a reflow process is performed, for example to form a metallic interconnect phase between under bump metallization and solder.

A first pattern 15 (e.g., one or more barcodes or other recognition codes that represent information of the semiconductor device package 1) may be formed in or on the conductive frame 14. In one embodiment, the first pattern 15 may be formed from the top surface 1411 into the top portion 141 of the conductive frame 14 using for example, laser techniques or other suitable techniques. Alternatively, the first pattern 15 may be applied, such as by way of a sticker. The first pattern 15 may be scanned, and the scanned pattern or the information it represents may be stored in a storage device (not shown in FIG. 2B). In some embodiments, a stored image of the first pattern 15 may be mapped to relevant information of the semiconductor device package 1a.

Referring to FIG. 2B, an electrically insulating material is injected or dispensed through the openings 14h of the conductive frame 14 to form an underfill 11 to encapsulate electrical contacts 12a of the active electrical components 12, 12', thereby forming a partial semiconductor device package 1b.

Singulation may be performed to divide a strip of semiconductor device packages 1b into a plurality of individual semiconductor device packages 1b. The singulation may be performed, for example, by using a dicing saw, laser or other appropriate cutting means.

Referring to FIG. 2C, an EMI shield 16 is formed on the external surface of the conductive frame 14 so as to be in contact with the top surface 1411 of the top portion 141 of the conductive frame 14, an outer lateral surface 1421 of the rim 142 of the conductive frame 14 and the surfaces 13a1, 13b1 of the electrical component 13.

The EMI shield 16 has a top surface 161 and a bottom surface 162 opposite to the top surface 161. In one embodiment, at least one insulation pad 173 is formed on the bottom surface 162 of the EMI shield 16 and is in contact with the surfaces 13a1, 13b1 of the electrical component 13, to electrically isolate the EMI shield 16 from the surfaces 13a1, 13b1 of the electrical component 13. In another embodiment, the surfaces 13a1, 13b1 of the electrical component 13 can be surfaces of an electrical insulator material, and thus the EMI shield 16 can be in direct contact with the surfaces 13a1, 13b1 of the electrical component 13, and the insulation pad(s) 173 eliminated.

The EMI shield 16 may be deposited as a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The EMI shield 16 may include a single conductive layer. In accordance with another embodiment of the present disclosure, the EMI shield 16 may include several conductive layers of either the same material or different materials.

A second pattern 18 (e.g., barcodes or other codes that correspond to information related to the semiconductor device package 1), is formed or placed on the top surface 161 of the EMI shield 16. In an embodiment, the second pattern 18 can be formed from the top surface 161 into the EMI shield 16 to form the semiconductor device package 1 as described and illustrated with reference to FIG. 1A. The second pattern 18 can be formed, for example, using laser techniques or other suitable techniques.

As described with respect to FIG. 2B, an electrically insulating material is introduced through the openings 14h of the conductive frame 14 to form the underfill 11. Accordingly, the conductive frame 14, the active electrical components 12, 12', the electrical components 13, 23, 33 and the conductive frame 14 can be placed and mounted on the top surface 101 of the substrate 10 by a single surface mount process, followed by reflow. By way of contrast, if conductive frame 14 did not have openings 14h, the underfill 11 would have to be introduced prior to the placement of the conductive frame 14, and a subsequent second surface mount process and reflow would be included to place the conductive frame 14 on the substrate 10. Thus, the use of openings 14h in the conductive frame 14 allows for reduced manufacturing costs.

Additionally, because the underfill 11 is formed subsequent to the connection of the conductive frame 14 and the connection member 17, the connection member 17 may act as a stop for the underfill 11. By way of contrast, if the conductive frame 14 had no openings 14h, the underfill 11 would be introduced prior to mounting the conductive frame 14 to the substrate 10. The semiconductor manufacturing process shown in FIG. 2A, FIG. 2B and FIG. 2C allows for a distance D between the edge of the active electrical component 12 and the connection member 17 to be less than about 0.2 mm. By contrast, if the conductive frame 14 had no openings 14h, so that the underfill 11 was applied prior to the mounting of the conductive frame 14, a distance which may be more than about 0.55 mm may be reserved from the edge of the active electrical component 12 to allow for the horizontal expansion of the underfill 11. In other words, to prevent the underfill 11 from expanding to occupy the space where the connection member 17 is to be formed subsequently, a space of about 0.55 mm or more would be reserved. Thus, the semiconductor manufacturing process shown in FIG. 2A, FIG. 2B and FIG. 2C may reduce the total width of the semiconductor device package 1 by at least about 0.35 mm on a side, which can, in turn, reduce manufacturing costs.

As used herein, the terms "substantially," "substantial," "approximately," and "about" are used to denote small variations. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers (μm) of lying along the same plane, such as within 100 μm, within 80 μm, within 60 μm, within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, +4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising
a substrate having a top surface;
a first electrical component disposed on the top surface of the substrate;
a second electrical component disposed on the top surface of the substrate, the second electrical component having a top surface;
a conductive frame defining a top portion and a rim substantially perpendicular to the top portion, the top portion having a top surface, the conductive frame disposed on the top surface of the substrate to cover the first electrical component, the conductive frame including at least one opening in the top portion of the conductive frame, the at least one opening exposing the second electrical component, and the top surface of the top portion of the conductive frame being substantially coplanar with the top surface of the second electrical component; and
an electromagnetic interference shield in contact with the top surface of the top portion of the conductive frame, an outer lateral surface of the rim of the conductive frame, and the top surface of the second electrical component.

2. The semiconductor device package of claim 1, wherein the first electrical component includes a plurality of electrical contacts, further comprising an underfill to encapsulate the plurality of electrical contacts.

3. The semiconductor device package of claim 1, wherein the conductive frame is disposed on the top surface of the substrate through a connection member.

4. The semiconductor device package of claim 3, wherein the connection member is separated from the first electrical component by a distance equal to or smaller than 0.2 millimeter.

5. The semiconductor device package of claim 1, further comprising a pattern formed in the top portion of the conductive frame.

6. The semiconductor device package of claim 1, further comprising a pattern formed in the electromagnetic interference shield.

7. The semiconductor device package of claim 1, further comprising at least one insulation pad formed on a bottom surface of the electromagnetic interference shield, wherein each of the at least one insulation pad contacts the top surface of the second electrical component.

8. The semiconductor device package of claim 1, further comprising a third electrical component disposed on the top surface of the substrate, wherein the conductive frame includes at least one compartment extending from the top portion of the conductive frame to separate the first electrical component from the third electrical component.

9. The semiconductor device package of claim 1, wherein the second electrical component extends vertically the highest in the semiconductor package.

10. A method of manufacturing a semiconductor device package, comprising:
    (a) providing a substrate having a top surface;
    (b) attaching a first electrical component and a second electrical component on the top surface of the substrate;
    (c) placing a conductive frame on the top surface of the substrate to cover the first electrical component, the conductive frame including a top portion and a rim substantially perpendicular to the top portion, the top portion having a top surface, the conductive frame defining at least one opening in the top portion of the conductive frame, the least one opening exposing the second electrical component, and the top surface of the top portion of the conductive frame being substantially coplanar with a top surface of the second electrical component; and
    (d) placing an electromagnetic interference shield on the conductive frame in contact with the top surface of the top portion of the conductive frame, an outer lateral surface of the rim of the conductive frame, and the top surface of the second electrical component.

11. The method of claim 10, further comprising forming an underfill to encapsulate a plurality of electrical contacts of the first electrical component.

12. The method of claim 11, wherein the underfill is formed by injecting or dispensing an electrically insulating material through the opening of the conductive frame above the first electrical component.

13. The method of claim 11, wherein the underfill is formed subsequent to placing the conductive frame in (c).

14. The method of claim 10, wherein the first electrical component, the second electrical component and the conductive frame are secured on the top surface of the substrate by a reflow process.

15. The method of claim 10, further comprising forming a pattern in the top portion of the conductive frame.

16. The method of claim 15, wherein prior to placing the EMI shield in (d), the pattern is scanned to read information corresponding to the semiconductor device package.

17. The method of claim 10, wherein in placing the conductive frame in (c), the conductive frame is placed on a connection member located on the top surface of the substrate.

18. The method of claim 10, further comprising forming at least one insulation pad on a bottom surface of the electromagnetic interference shield, positioned so as to be in contact with the top surface of the second electrical component.

19. The method of claim 10, further comprising forming at least one compartment extending from the top portion of the conductive frame to separate the first electrical component from a third electrical component disposed on the top surface of the substrate.

20. The method of claim 10, further comprising forming a pattern in the electromagnetic interference shield.

* * * * *